(12) United States Patent
Gemmill

(10) Patent No.: US 8,168,577 B2
(45) Date of Patent: May 1, 2012

(54) POST PLASMA ETCH/ASH RESIDUE AND SILICON-BASED ANTI-REFLECTIVE COATING REMOVER COMPOSITIONS CONTAINING TETRAFLUOROBORATE ION

(75) Inventor: William R. Gemmill, Bethlehem, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 60 days.

(21) Appl. No.: 12/811,257

(22) PCT Filed: Feb. 5, 2009

(86) PCT No.: PCT/US2009/033148
§ 371 (c)(1),
(2), (4) Date: Jun. 30, 2010

(87) PCT Pub. No.: WO2009/108474
PCT Pub. Date: Sep. 3, 2009

(65) Prior Publication Data
US 2011/0046036 A1  Feb. 24, 2011

Related U.S. Application Data

(60) Provisional application No. 61/032,449, filed on Feb. 29, 2008.

(51) Int. Cl.
C11D 7/50 (2006.01)
G03F 7/42 (2006.01)

(52) U.S. Cl. .................. 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 4,401,747 A | 8/1983 | Ward, Jr. et al. | |
| 4,491,530 A | 1/1985 | Thomas | |
| 5,480,585 A | 1/1996 | Shiotsu et al. | |
| 5,571,447 A | 11/1996 | Ward et al. | |
| 5,972,862 A | 10/1999 | Torii et al. | |
| 6,043,206 A | 3/2000 | Song et al. | |
| 6,150,282 A | 11/2000 | Rath et al. | |
| 6,211,127 B1 | 4/2001 | Kim et al. | |
| 6,265,309 B1 | 7/2001 | Gotoh et al. | |
| 6,432,209 B2 | 8/2002 | Sahbari | |
| 6,777,380 B2 | 8/2004 | Small et al. | |
| 6,821,352 B2 | 11/2004 | Rovito et al. | |
| 6,828,289 B2 | 12/2004 | Peters et al. | |
| 7,129,029 B2 | 10/2006 | Egbe | |
| 7,166,419 B2 | 1/2007 | Egbe | |
| 7,192,860 B2 | 3/2007 | McFarland et al. | |
| 7,671,001 B2 * | 3/2010 | Skee | 510/175 |
| 7,960,328 B2 * | 6/2011 | Visintin et al. | 510/175 |
| 2002/0005506 A1 | 1/2002 | Yano et al. | |
| 2003/0022800 A1 | 1/2003 | Peters et al. | |
| 2006/0014656 A1 | 1/2006 | Egbe et al. | |
| 2006/0199749 A1 | 9/2006 | Suzuki et al. | |
| 2007/0000523 A1 | 1/2007 | Kim et al. | |
| 2007/0060490 A1 * | 3/2007 | Skee | 510/175 |
| 2007/0281386 A1 | 12/2007 | Park | |
| 2008/0125342 A1 | 5/2008 | Visintin et al. | |
| 2008/0139436 A1 * | 6/2008 | Reid | 510/176 |
| 2008/0161217 A1 | 7/2008 | Zhang et al. | |
| 2008/0261847 A1 * | 10/2008 | Visintin et al. | 510/176 |
| 2009/0212021 A1 | 8/2009 | Bernhard et al. | |
| 2010/0163788 A1 | 7/2010 | Visintin et al. | |

FOREIGN PATENT DOCUMENTS

WO WO 2008/023858  2/2008

OTHER PUBLICATIONS

Arnett et al., "Solvent Effects in Organic chemisty. II. Sulfolane . . . ", 1964, Contribution No. 1175 from the Department of Chemistry of the University of Pittsburgh, Pittsburgh 13, Penna, vol. 86, pp. 409-412.

Jones, "Contrasing Behavior of boron Trifluoride and Phosphorus Pentafluoride toward Sulfolane", Inorganic Chemistry, 1966, vol. 5, No. 7, pp. 1229-1232.

Wamser, "Equilibria in the System Boron Trifluoride-Water at 25°", Contribution from the Laboratory of C.A. Wamser, 1951, vol. 73 pp. 409-416.

Wamser, "Hydrolysis of Fluoboric Acide in Aqueious Solution", contribution from the Laboratory of C.A. Wamser, 1948, pp. 1209-1215.

* cited by examiner

Primary Examiner — Gregory Webb
(74) Attorney, Agent, or Firm — Hoffman & Baron, LLP

(57) ABSTRACT

A microelectronic cleaning compositions of: a) from about 80% to about 99% by weight of the composition of at least one organic sulfone; b) from about 0.5% to about 19% by weight of the composition of water; and c) from about 0.5% to about 10% by weight of the composition of at least one component providing tetrafluoroborate ion, and d) optionally at least one polyhydric alcohol is especially useful to clean etch/ash residues from microelectronic substrates or device having both Si-based anti-reflective coatings and low-k dielectrics.

20 Claims, No Drawings

US 8,168,577 B2

POST PLASMA ETCH/ASH RESIDUE AND SILICON-BASED ANTI-REFLECTIVE COATING REMOVER COMPOSITIONS CONTAINING TETRAFLUOROBORATE ION

CROSS REFERENCE TO RELATED APPLICATIONS

This application is a national stage application of PCT/US2009/033148, filed Feb. 5, 2009, which claims the benefit of U.S. Provisional Application No. 61/032,449 filed Feb. 29, 2008.

FIELD OF THE INVENTION

This invention relates to compositions useful in cleaning microelectronic substrates by removing post plasma etch or post etch/ash residue as well as silicon-based anti-reflective coatings and being able to do so while being compatible with aluminum, copper and low-k dielectrics, and particularly porous low-k dielectrics. In particular the invention provides substantially solvent based remover compositions and also provides method for cleaning microelectronic substrates and devices employing such compositions.

BACKGROUND TO THE INVENTION

Semiconductor devices have been produced by the steps of coating an inorganic substrate with a photoresist; patterning the photoresist film by exposure to light and subsequent development; etching exposed region of the inorganic substrate using the patterned photoresist film as a mask to form minute circuits; and removing the patterned photoresist film from the inorganic substrate. Alternatively, after forming minute circuits in the same manner as above, the patterned photoresist film is ashed, and then the remaining resist residues are removed from the inorganic substrate.

With the advance to smaller circuit lines and the employment of more advanced lithography (e.g., 193 nm, ArF) to obtain same, anti-reflective coatings have been needed in order to control critical dimension (CD) and to maintain high image quality. Thus, the role of Si based spin-on anti-reflective coatings has expanded recently to incorporate pattern transfer responsibilities. The advantage of the use of such spin-on Si based anti-reflective coatings is generally at least two-fold: they are easily planarizable and are of sufficient different chemical composition from the photoresist required to be employed with ArF at 193 nm lithography so that high resolution pattern transfer during dry etch is facilitated. However, subsequent to the dry etch step, it is necessary to remove any photoresist or photoresist residue and the remaining anti-reflective coating without damaging the dielectric layer underneath or any metallization that has been undertaken.

There is therefore a need to provide a cleaning composition for removing etch/ash residue, photoresist and anti-reflective coatings while not damaging any underlying dielectric layer or metallization of the microelectronic device. It is particularly desirable to provide a cleaning composition for removing etch/ash residue, photoresist and Si-anti-reflective coatings while not damaging any underlying low-k dielectric layer, particularly any porous low-k dielectric layer, which are inherently chemically similar materials, and without damaging any metallization of the microelectronic device, particularly copper or aluminum metallization.

SUMMARY OF THE INVENTION

The residue removing cleaning compositions of this invention are acidic tetrafluoroborate containing solvent based compositions. These compositions have a pH of 3 or less and contain from about 80 percent to about 99 percent by weight of a sulfone solvent, from about 0.25 percent to 19 percent by weight water, from about 0.25 percent to 10 percent by weight of at least one component providing tetrafluoroborate ions ($BF_4^-$). The compositions may contain chelating agents, a polyhydric alcohol, surfactants and acids. The compositions of this invention may be employed to clean microelectronic substrates to remove etch/ash residues, especially from those microelectronic substrates containing Si-containing anti-reflective coatings also having present an underlying low-k dielectric layer, particularly any porous low-k dielectric layer. To accomplish cleaning of the microelectronic substrates or devices the microelectronic substrates or devices are contacted with the compositions of this invention for a time and at a temperature sufficient to accomplish such cleaning.

DETAILED DESCRIPTION OF THE INVENTION

Residue removing cleaning compositions of this invention are acidic tetrafluoroborate containing, organic sulfone solvent based compositions. These compositions have a pH of 3 or less and contain from about 80% to about 99% by weight of at least one sulfone solvent, from about 0.25% to about 19% water and from about 0.25% to about 10% by weight of at least one component providing tetrafluoroborate ions ($BF_4^-$).

Any suitable organic sulfone may be employed in the compositions of this invention. Suitable sulfones include, but are not limited to, dimethyl sulfone, diethyl sulfone, diphenyl sulfone, 2-(methylsulfonium) ethanol, methyl phenyl sulfone, ethyl phenyl sulfone, dibutyl sulfone, dibenzyl sulfone, and tetrahydrothiophene-1,1-dioxide (sulfolane). Sulfolane is preferred. The amount of sulfone component present in the cleaning compositions of this invention will generally in the range of from about 80% to about 99% by weight of the composition, preferably from about 85% to about 95%, and more preferably from about 89% to about 93%.

The amount of water present in the cleaning compositions of this invention will generally be in an amount of from about 0.25% to about 19% by weight of the composition, preferably from about 2% to about 14%, and more preferably from about 4% to about 10%.

The components providing the tetrafluoroborate ions can be any suitable ionizable tetrafluoroborate containing compound, such as, but not limited to tetrafluoroboric acid $HBF_4$ and salts thereof in combination with strong mineral acids. Suitable salts include, but not limited to ammonium tetrafluoroborate ($NH_4BF_4$), N-methyl-N-alkylpyrrolidinium tetrafluoroborate salts, alkylammonium tetrafluoroborate salts, alkali metal tetrafluoroborate salts such as lithium sodium or potassium tetrafluoroborates. Any suitable strong mineral acid may be employed with the tetrafluoroborate salt, and include, but are not limited to, strong mineral acids such as hydrochloric acid, sulfuric acid, phosphoric acid, and nitric acid. Preferred for use in the cleaning compositions of this invention in order to provide the tetrafluoroborate ions is tetrafluoroboric acid, $HBF_4$. Tetrafluoroboric acid is generally commercially available as a 48% aqueous solution and may be used as such. Tetrafluoroboric acid undergoes hydrolysis producing some quantity of HF. It is the availability of HF in the compositions that permits the selective etch of Si-based materials. The component providing the tetrafluoroborate ions will generally be present in the cleaning compositions of this invention in an amount of from about 0.25% to about 10% by weight of the composition, preferably from about 1.5% to about 7%, and more preferably from about 2.5% to about 4.5%.

The pH of the cleaning compositions of this invention will be pH 3 or less, preferably a pH of about 2. The highly acidic nature of the cleaning compositions of this invention can generally be attributed to the properties of the sulfone component. Sulfolane is an aprotic solvent that is not protonated in the presence of strong acids. This characteristic allows for very high acidities at low acid concentration compared to aqueous solutions of strong inorganic mineral acids.

Efforts to prepare similar compositions with alternative Lewis base solvents, such as for example DMSO and glycol ethers were unsuccessful. The aforementioned formulations did not possess the selectivity for removing Si-based anti-reflective coatings nor did they maintain compatibility with Cu. Sulfones and $BF_3$ form a stable complex. It has been reported that the tetrafluoroborate ion ($BF_4^-$) will dissociate to $BF_3$ and $F^{-4}$. In the present invention it is believed that the sulfone-$BF_3$ complex contributes to the reduction of the copper etch rates to acceptable values.

The cleaning compositions of this invention may optionally contain at least one polyhydric alcohol. If present in the cleaning composition of this invention the polyhydric alcohol component may be present in an amount of from about 1 wt % to about 10 wt % of the cleaning composition, preferably from about 2 wt % to about 8 wt %, and more preferably from about 3 wt % to about 6 wt %. Suitable polyhydric alcohols include, but are not limited to, ethylene glycol, glycerol, erythritol, arabitol, xylitol, mannitol, and sorbitol, with glycerol being preferred. Formulations utilizing a polyhydric alcohol have proven (Table X) to possess increased Cu compatibility and photoresist residue removal capability.

The cleaning compositions of this invention are capable of maintaining exceptionally high (up to about 70:1) etch selectivity for anti-reflective coating to low-k dielectrics even though they are inherently somewhat similar materials. The pH of the cleaning compositions of this invention, which is 3 or less, imparts the aforementioned etch selectivity upon the cleaning compositions since at pH values greater than 3 the cleaning compositions will unacceptably etch the low-k dielectric materials.

The cleaning compositions of this invention can be used effectively to remove/clean post plasma etch/ash residue, metal based hard masks, and Si-based anti-reflective coatings. The compositions of the invention also exhibit copper and low-k dielectric compatibility. Some compositions of the invention also exhibit aluminum compatibility.

The desirable etch rate selectivity of the cleaning compositions of this invention is illustrated by the etch rate data in Table 1 for Si based anti-reflective coatings, copper and aluminum metallizations and dielectrics, inclusive of low-k dielectrics. In this etch example the cleaning compositions of this invention employed was one containing 3 wt % $HBF_4$, 3.25 wt % water and 93.75 wt % sulfolane. The materials listed in the Table were treated with this cleaning composition at 60° C. for 10 minutes and the following etch rates were observed.

TABLE 1

| Material tested | Etch rate (Angstroms/minute) |
|---|---|
| Honeywell DUO ™-193 Si-based anti reflective coating | 90 |
| Ti | 70 |

TABLE 1-continued

| Material tested | Etch rate (Angstroms/minute) |
|---|---|
| Tetraethylorthosilicate (TEOS) dielectric | 3 |
| Cu | 5.5 |
| p-Coral low-k dielectric | 2 |
| Applied Materials, Inc. Black Diamond 2x low-k dielectric | 7 |

Prior art cleaning compositions had been tested to determine if they had Si-based etch selectivity between Si based anti-reflective coatings and dielectrics.

The composition of Example 1 of US Patent Application Publication No. US 2006/0014656 was tested against Honeywell Duo™-193 Si-based anti-reflective coating, copper and TEOS and Black Diamond 2 dielectrics at 50° C. for ten minutes and the observed etch rates in Angstroms/minute were as follows.

TABLE 2

| CU | TEOS | DUO ™193 | Black Diamond 2 |
|---|---|---|---|
| <1 | >100 | >140. | >250 |

This prior art formulation will etch and remove the Si-based anti-reflective coating with good etch rate but will also unacceptably etch the low$_k$ Black Diamond dielectric.

The composition of Example 23 in Table 4 of US Patent Application Publication No. US 2006/199749 was tested against Honeywell Duo™-193 Si-based anti-reflective coating, copper and TEOS and Black Diamond 2 dielectrics at 25° C. and 35° C. for ten minutes and the observed etch rates in Angstroms/minute were as follows.

TABLE 3

| Temp ° C. | Cu | TEOS | DUO$^{tm-193}$ | Black Diamond 2 |
|---|---|---|---|---|
| 25° C. | 1 | 3 | 1 | 31 |
| 35° C. | 2 | 3 | 5 | 1 |

This mostly water-containing with glycolic ether acidic fluoride based formulation could not remove Si-based anti-reflective material from substrates.

The criticality off the cleaning compositions of this invention having sulfone solvent present as the solvent and the necessity to avoid having glycol ethers present in the cleaning compositions is demonstrated by the following tests. The following three cleaning compositions were prepared. Compositions A (of this invention) contained 92.7% sulfolane, 3.8% water and 3.5% tetrafluoroboric acid. In Comparative Composition B, a portion of the sulfolane was replaced with Carbitol (diethylene glycol monomethyl ether) and in Comparative Compositions C sulfolane was completely replaced by Carbitol. Each of these compositions was tested against Honeywell Duo™-193 Si-based anti-reflective coating, copper, TEOS, and Black Diamond 2 dielectrics for 30 minutes at 60° C. The etch results in Angstrom/minute were as follows.

TABLE 4

| Composition | Cu | TEOS | DUO ™-193 | Black Diamond 2 |
|---|---|---|---|---|
| A | <3 | 3 | >140 | <2 |
| B | 18 | 2 | 43 | 0 |
| C | 300 | 3 | 41 | 0 |

The inclusion of glycol ether, either partially or completely, into the compositions of this invention destroys the selective etch of Si-based anti-reflective coating when compared to Cu.

The desirable etch rate selectivity of the cleaning compositions of this invention is illustrated by the etch rate data in Table 1 for Si based anti-reflective coating, DUO™-193, copper and aluminum metallizations and dielectrics, inclusive of low-k dielectrics. All chemicals were used as received from the suppliers. The HBF$_4$ used in this study was a 48% by weight aqueous solution. All etch rates (Angstroms/minute) were determined at 60° C. Substrates of Cu, Al, and Black Diamond 2 (BD2) were treated for 30 minutes. DUO™ was treated for 10 minutes (initial thickness was about 1400 Angtroms). pH measurements were determined from a 10% by weight aqueous solution of the composition. CuOx removal was judged based on visual inspection of Cu coated wafers that had been submerged in 30% H$_2$O$_2$ for about 30 minutes prior to the one minute treatment in the compositions listed below.

TABLE 5

| Comp. No. | Sulfolane | 48% Aq. HBF$_4$ | Additional H$_2$O | Glycerol | pH | Chelator* | Cu | DUO™ | BD2 | CuO$_x$ |
|---|---|---|---|---|---|---|---|---|---|---|
| 12 | 93 | 7 | 0 | 0 | 1.65 | No | <1 | .140 | 2.2 | Yes |
| 2 | 85 | 15 | 0 | 0 | 1.28 | No | 4.4 | .140 | 6.8 | Yes |
| 3 | 80 | 3 | 17 | 0 | 1.99 | No | 3.2 | 5.6 | <1 | Yes |
| 4 | 80 | 7 | 13 | 0 | 1.66 | No | 4.0 | 16 | 1.9 | Yes |
| 5 | 93 | 7 | 0 | 0 | 1.42 | DTPA | 2.2 | >140 | 1.8 | Yes |
| 6 | 93 | 7 | 0 | 0 | 1.41 | EDTA | 5.5 | >140 | 1.9 | Yes |
| 7 | 983 | 7 | 0 | 0 | 1.52 | CyDTA | 1.4 | >140 | 1.5 | Yes |
| 8 | 82 | 8 | 0 | 10 | 1.51 | No | 3.4 | 9.0 | <1 | Yes |
| 9 | 82 | 8 | 5 | 5 | 1.53 | No | 5.4 | >100 | 2.1 | Yes |
| 10 | 82 | 3 | 5 | 10 | 1.90 | No | 3.6 | <1 | <1 | Yes |
| 11 | 82 | 3 | 5 | 5 | 1.88 | No | 3.5 | <1 | <1 | Yes |

*Chelator present in about 0.25% by weight: DTPA = Diethylenetriaminepentaacetic acid, EDTA = Ethylenediaminetetraacetic acid, and CyDTA = 1,2-Diaminocyclohexane-N,N,N',N',-tetraacetic acid;
BD2 = Black Diamond 2-low K dielectric of Applied Material, Inc.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims

What is claimed is:

1. A microelectronic substrate cleaning compositions comprising:
    a) from about 80% to about 99% by weight of the composition of at least one organic sulfone;
    b) from about 0.25% to about 19% by weight of the composition of water; and
    c) from about 0.25% to about 10% by weight of the composition of at least one component providing tetrafluoroborate ions
    wherein the pH of the composition, as a 10% by weight aqueous solution of the composition, is 3 or less.

2. A microelectronic substrate cleaning composition according to claim 1 additionally comprising from about 1% to about 10% by weight of at least one polyhydric alcohol.

3. A microelectronic substrate cleaning composition according to claim 1 wherein the sulfone comprises sulfolane.

4. A microelectronic substrate cleaning composition according to claim 1 wherein the at least one component providing tetrafluoroborate ions comprises tetrafluoroboric acid.

5. A microelectronic substrate cleaning composition according to claim 3 wherein the at least one component providing tetrafluoroborate ions comprises tetrafluoroboric acid.

6. A microelectronic substrate cleaning composition according to claim 2 wherein at polyhydric alcohol comprises glycerol.

7. A microelectronic substrate cleaning composition according to claim 6 wherein the at least one sulfone comprises sulfolane and the at least one component providing tetrafluoroborate ions comprises tetrafluoroboric acid.

8. A process for cleaning a microelectronic substrate or device of post etch/ash residue comprises contacting the microelectronic substrate or device with a cleaning composition comprising:
    a) from about 80% to about 99% by weight of the composition of at least one organic sulfone;
    b) from about 0.25% to about 19% by weight of the composition of water; and
    c) from about 0.25% to about 10% by weight of the composition of at least one component providing tetrafluoroborate ions
    wherein the pH of the composition, as a 10% by weight aqueous solution of the composition, is 3 or less.

9. A process according to claim 8 wherein the cleaning composition additionally comprising from about 1% to about 10% by weight of at least one polyhydric alcohol.

10. A process according to claim 8 wherein the sulfone comprises sulfolane.

11. A process according to claim 8 wherein the at least one component providing tetrafluoroborate ions comprises tetrafluoroboric acid.

12. A process according to claim 10 wherein the at least one component providing tetrafluoroborate ions comprises tetrafluoroboric acid.

13. A process according to claim 9 wherein at polyhydric alcohol comprises glycerol.

14. A process according to claim 13 wherein the at least one sulfone comprises sulfolane and the at least one component providing tetrafluoroborate ions comprises tetrafluoroboric acid.

15. A process according to claim 8 wherein the microelectronic substrate or device comprises a Si-based anti-reflective coating and a low-k dielectric.

16. A process according to claim 14 wherein the microelectronic substrate or device comprises a Si-based anti-reflective coating and a low-k dielectric.

17. A process for cleaning a microelectronic substrate or device of post etch/ash residue, photoresist and Si-based anti-reflective coating while not damaging an underlying dielectric layer or metallization of the microelectronic substrate or device, the process comprises contacting the microelectronic substrate or device with a cleaning composition comprising:
   a) from about 80% to about 99% by weight of the composition of at least one organic sulfone;
   b) from about 0.25% to about 19% by weight of the composition of water; and
   c) from about 0.25% to about 10% by weight of the composition of at least one component providing tetrafluoroborate ions wherein the pH of the composition, as a 10% by weight aqueous solution of the composition, is 3 or less.

18. A process according to claim 17 wherein the composition has a pH of about 2.

19. A process according to claim 17 wherein the dielectric layer is a porous low-k dielectric layer.

20. A process according to claim 19 wherein the cleaning composition comprises $HBF_4$, sulfolane and water.

\* \* \* \* \*